(12) United States Patent
Leming et al.

(10) Patent No.: US 7,811,410 B2
(45) Date of Patent: Oct. 12, 2010

(54) MATCHING CIRCUIT FOR A COMPLEX RADIO FREQUENCY (RF) WAVEFORM

(75) Inventors: Andres Leming, Dublin, CA (US); Andras Kuthi, Thousand Oaks, CA (US); Thomas Anderson, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 257 days.

(21) Appl. No.: 12/142,062

(22) Filed: Jun. 19, 2008

(65) Prior Publication Data

US 2009/0315596 A1    Dec. 24, 2009

(51) Int. Cl.
*C23F 1/02* (2006.01)
*C23C 16/00* (2006.01)

(52) U.S. Cl. .............. 156/345.44; 156/345.48; 156/345.47; 118/723 I; 118/723 VE; 118/723 IR; 118/723 E

(58) Field of Classification Search .......... 315/111.71, 315/111.51, 111.41, 111.21, 111.11, 111.01; 156/345.44, 345.48, 345.47, 345.43; 118/723 I, 118/723 VE, 723 IR, 723 E
See application file for complete search history.

(56) References Cited

U.S. PATENT DOCUMENTS

| | | | |
|---|---|---|---|
| 6,917,204 B2 * | 7/2005 | Mitrovic et al. | 324/464 |
| 7,169,256 B2 * | 1/2007 | Dhindsa et al. | 156/345.47 |
| 7,503,996 B2 * | 3/2009 | Chen et al. | 156/345.44 |
| 2003/0054647 A1 | 3/2003 | Suemasa et al. | |
| 2004/0035837 A1 | 2/2004 | Mitrovic et al. | |
| 2005/0133163 A1 | 6/2005 | Shannon et al. | |
| 2005/0264218 A1 | 12/2005 | Dhindsa et al. | |

OTHER PUBLICATIONS

"International Application Serial No. PCT/US2009/047675, International Search Report and Written Opinion mailed Jan. 29, 2010", 10 pgs.

* cited by examiner

*Primary Examiner*—Tuyet Thi Vo
(74) *Attorney, Agent, or Firm*—Schwegman, Lundberg & Woessner, P.A.

(57) ABSTRACT

A complex waveform frequency matching device is disclosed. In various embodiments, the matching device comprises a plurality of radio frequency generators coupled in parallel with one another. Each subsequent one of the plurality of radio frequency generators is configured to produce a harmonic frequency related by an integral multiple to a frequency produced by any lower-frequency producing radio frequency generator, thereby generating a complex waveform. A plurality of frequency splitter circuits is coupled to an output of the plurality of radio frequency generators, and each of a plurality of matching networks has an input coupled to an output of one of the plurality of frequency splitter circuits and an output configured to be coupled to a plasma chamber.

29 Claims, 3 Drawing Sheets

MATCHING CIRCUIT FOR A COMPLEX RADIO FREQUENCY (RF) WAVEFORM

TECHNICAL FIELD

The present invention relates generally to the field of process equipment used in the semiconductor, data storage, flat panel display, as well as allied or other industries. More particularly, the present invention relates to a system to efficiently couple complex RF waveforms to a plasma load in plasma-based process equipment.

BACKGROUND

Semiconductor device geometries (i.e., integrated circuit design rules) have decreased dramatically in size since integrated circuit (IC) devices were first introduced several decades ago. ICs have generally followed "Moore's Law," which means that the number of devices fabricated on a single integrated circuit chip doubles every two years. Today's IC fabrication facilities are routinely producing 65 nm (0.065 µm) feature size devices, and future fabs will soon be producing devices having even smaller feature sizes.

In most IC fabrication facilities, part of the fabrication process involves employing plasma in process equipment to either react or facilitate a reaction with a substrate such as a semiconductor wafer. Radio frequency (RF) or microwave power supply generators are widely used in semiconductor and industrial plasma processing equipment to generate the plasmas in a process chamber. Plasma processing is used for a wide variety of applications including etching of materials from substrates, deposition of materials onto substrates, cleaning of substrate surfaces, and modification of substrate surfaces.

With reference to FIG. 1, a cross-sectional view of a portion of a prior art plasma-based process system 100 includes a vacuum chamber 109 having a chamber wall 101. At least a portion of the chamber wall 101 includes a window 103, typically formed of quartz or a similar material which is transparent to radio frequency (RF) waves at the operating frequencies of the plasma-based process system 100. A coil 115 is located outside of the vacuum chamber 109 and surrounds the window 103. An RF generator 119 is connected across the coil 115 through a matching network 117. The matching network 117 provides a means of matching an output impedance of the RF generator 119 to an input impedance of the vacuum chamber 109. The matching network 117 may contain fixed elements only, or it may contain elements such as variable capacitors and variable inductors allowing dynamic impedance matching of the RF generator 119 to changing load conditions.

The RF generator 119 in the plasma-based process system 100 is the primary plasma generating portion provided to energize the plasma in the vacuum chamber 109. The plasma could also be generated by a capacitive electrode (not shown) immersed in the plasma or by an inductive coil (not shown) immersed in the plasma.

Process gases are introduced into the vacuum chamber 109 from a plurality of feed gas supply reservoirs 105 (only one is shown). A vacuum pump 107 is configured to establish a vacuum level within the vacuum chamber 109 suitable for a particular process (e.g., plasma etch or deposition) being performed in the plasma-based process system 100. The vacuum pump 107 is further configured to exhaust process gases from the vacuum chamber 109.

A substrate 113 (e.g., a semiconductor wafer) is supported in the vacuum chamber 109 by a substrate support, typically an electrostatic chuck (ESC) 111. The ESC 111 acts as a cathode within the plasma-based process system 100 and develops an electrostatic potential to hold the substrate 113 in place during processing, thus avoiding the problems of mechanical clamping by having contact with only the back side of the substrate 113. The ESC 111 operates by inducing opposing charges between the substrate 113 and the ESC 111 thereby resulting in an electrostatic attraction between the two pieces. Thus, a resulting capacitance exists between the ESC 111 and the substrate 113. The capacitance is large enough such that an insignificant drop in RF voltage exists between the ESC 111 and the substrate 113 during processes performed at the high frequencies involved.

The plasma-based process system 100 further includes an anode (not shown directly although the anode is typically formed of the chamber wall 101 and/or chamber top) within the vacuum chamber 109. To process the substrate 113, a reactive gas is pumped from one or more of the plurality of feed gas supply reservoirs 105 into the vacuum chamber 109. The anode and ESC 111 (acting as a cathode) are driven by a single sinusoidal frequency from the RF generator 119 to excite the reactive gas into a plasma. The single frequency is typically 13.56 MHz, although single frequencies from 100 kHz to 2.45 GHz are often used, with an occasional use of other single frequencies. More specifically, a single frequency, sinusoidal RF signal is generally applied to the reactive gas within the chamber at a relatively high-power level, for example, at 3 kilowatts. The RF power excites the reactive gas, producing the plasma within the vacuum chamber 109 proximate to the substrate 113 being processed. The plasma-enhanced reactive ion process is commonly employed in etch and chemical vapor deposition processes.

More recently, multiple sinusoidal frequencies have been used to excite the plasma within a vacuum chamber. In these systems, a cathode/anode bias circuit is driven with a first RF frequency and an antenna or coil, proximate to the vacuum chamber, is driven with a second RF frequency. Thus, each circuit is coupled to a separate and distinct RF power delivery system consisting of separate RF oscillators, preamplifiers, power amplifiers, transmission lines, and matching networks that supply independent sinusoidal RF frequencies at high power levels to each of the plasma excitation circuits. The redundant oscillators and other associated circuitry are costly and complex. In other systems, both the first and second frequencies are supplied to a single electrode but frequently suffer from a reduction in power transfer since both frequencies cannot be matched concurrently.

If impedances of the power source and the load (i.e., the element coupled to the plasma) are not matched, the power supplied to (or absorbed by) the load is reflected and power transfer is therefore not maximized. Thus, controlling the amount of power absorbed or reflected by the load is important. Additionally, unmatched impedances can be detrimental to the power source or to other components coupled to the power source. In most cases the load impedance (i.e., the input impedance of the plasma coupling element) cannot be determined in advance, since it is dependent on the state or condition of the plasma to which it is coupled, and the plasma state can vary during processing. Accordingly, many plasma processing systems utilize a matching network provided between the RF source and the plasma coupling element to match input and output impedances. The matching network is utilized in order to maximize the amount of RF power supplied to the plasma, and to control the amplitude and phase of the bias power.

Recently, studies indicate that tailoring of ion energy in a plasma reactor can be used advantageously in semiconductor wafer processing. Complex radio frequency (RF) waveforms can be generated and delivered to a bias electrode of the plasma reactor and used to produce desirable effects in the generated plasma. The complex RF waveforms may contain ten or more harmonic frequencies or as few as two (a fundamental frequency with a second phase-shifted harmonic).

However, the complex waveforms are difficult to match to the plasma load due to the presence of the harmonic frequencies. Prior art matching systems described above are only capable of matching a single frequency RF waveform to a plasma chamber and are therefore incapable of providing adequate bandwidth for a complex waveform comprised of various frequencies. Moreover, an impedance of the apparent plasma load can be dependent on the frequency of the input waveform. Therefore, a system for matching the complex waveforms to the plasma reactor is required to efficiently match the impedance of each of the harmonic frequencies to the plasma generator.

SUMMARY

In an exemplary embodiment, a complex waveform frequency matching device is disclosed. The matching device comprises a plurality of radio frequency generators coupled in parallel with one another. Each subsequent one of the plurality of radio frequency generators is configured to produce a harmonic frequency related by an integral multiple to a frequency produced by any lower-frequency producing radio frequency generator, thereby generating a complex waveform. A plurality of frequency splitter circuits is coupled to an output of the plurality of radio frequency generators, and each of a plurality of matching networks has an input coupled to an output of one of the plurality of frequency splitter circuits and an output configured to be coupled to a plasma chamber.

In another exemplary embodiment, a complex waveform frequency matching device is disclosed. The matching device comprises a plurality of radio frequency generators coupled in parallel with one another. Each subsequent one of the plurality of radio frequency generators is configured to produce a harmonic frequency related by an integral multiple to a frequency produced by any lower-frequency producing radio frequency generator, thereby generating a complex waveform. A frequency analyzer is coupled to an output of the plurality of radio frequency generators, a plurality of frequency splitter circuits is coupled to an output of the frequency analyzer, and each of a plurality of matching networks has an input coupled to an output of one of the plurality of frequency splitter circuits and an output configured to be coupled to a plasma chamber.

In another exemplary embodiment, a complex waveform frequency matching device is disclosed. The matching device comprises a radio frequency generator configured to generate the complex waveform, a plurality of frequency splitter circuits coupled to an output of the radio frequency generator, and a plurality of matching networks. Each of the plurality of matching networks has an input coupled to an output of one of the plurality of frequency splitter circuits and an output configured to be coupled to a plasma chamber.

BRIEF DESCRIPTION OF THE DRAWINGS

The appended drawings merely illustrate exemplary embodiments of the present invention and must not be considered as limiting its scope.

DETAILED DESCRIPTION

Various embodiments of the present invention are configured to allow matching of an RF signal composed of a plurality of frequencies (i.e., a complex waveform) to be matched to a plasma chamber with minimal signal reflections and concomitant maximized power transfer. As a result, ion energy can be specifically tailored through use of the complex waveform in plasma reactors used for advanced semiconductor processing.

The present invention is therefore particularly well-suited for handling bias voltages having a complex waveform. For example, a specifically tailored complex waveform may include a pulse peak followed by a ramp down of voltage from a first level, lower than the pulse peak, to a second lower voltage level. A period of the complex waveform applied to a DC blocking capacitor (not shown) and the ramp down of voltage in each cycle are selected to compensate for and substantially cancel any effect of ion accumulation on a substrate contained within the process chamber to maintain a substantially constant DC self-bias voltage on the substrate between voltage pulse peaks. The complex waveform at the substrate has a cycle comprised of a narrow pulse of voltage, during which electrons are attracted from the plasma to the substrate, followed by a substantially constant DC bias voltage level resulting from a self-bias of the substrate maintained by the DC blocking capacitor. Where there is a single narrow voltage pulse peak followed by a ramp down in voltage during each cycle of the bias voltage, the ion energy distribution function for ions at the surface of the substrate has a single narrow peak centered at a selected ion energy. Each cycle of the bias voltage applied to the DC blocking capacitor may comprise two narrow voltage pulse peaks each followed by a ramp down of voltage, with the separation in time between voltage pulse peaks, the heights of the voltage pulse peaks, and the ramp down of voltage between pulse peaks are selected to provide a bias voltage at the substrate comprising two voltage pulses during each cycle with DC self-bias voltages following each pulse which are two different substantially constant DC levels, thereby providing an ion energy distribution function at the substrate that includes two peaks of ion flux centered at two selected ion energies with substantially no ion flux at other ion energies.

A skilled artisan can readily envision that such a complex waveform as described above is comprised of a number of frequencies simultaneously generated. In order to maintain the integrity of magnitude of each of the individual frequencies, each frequency must be independently impedance-matched to the plasma chamber. However, appropriate impedance matching may only be determined once a spectral frequency domain is known.

Figure 1:
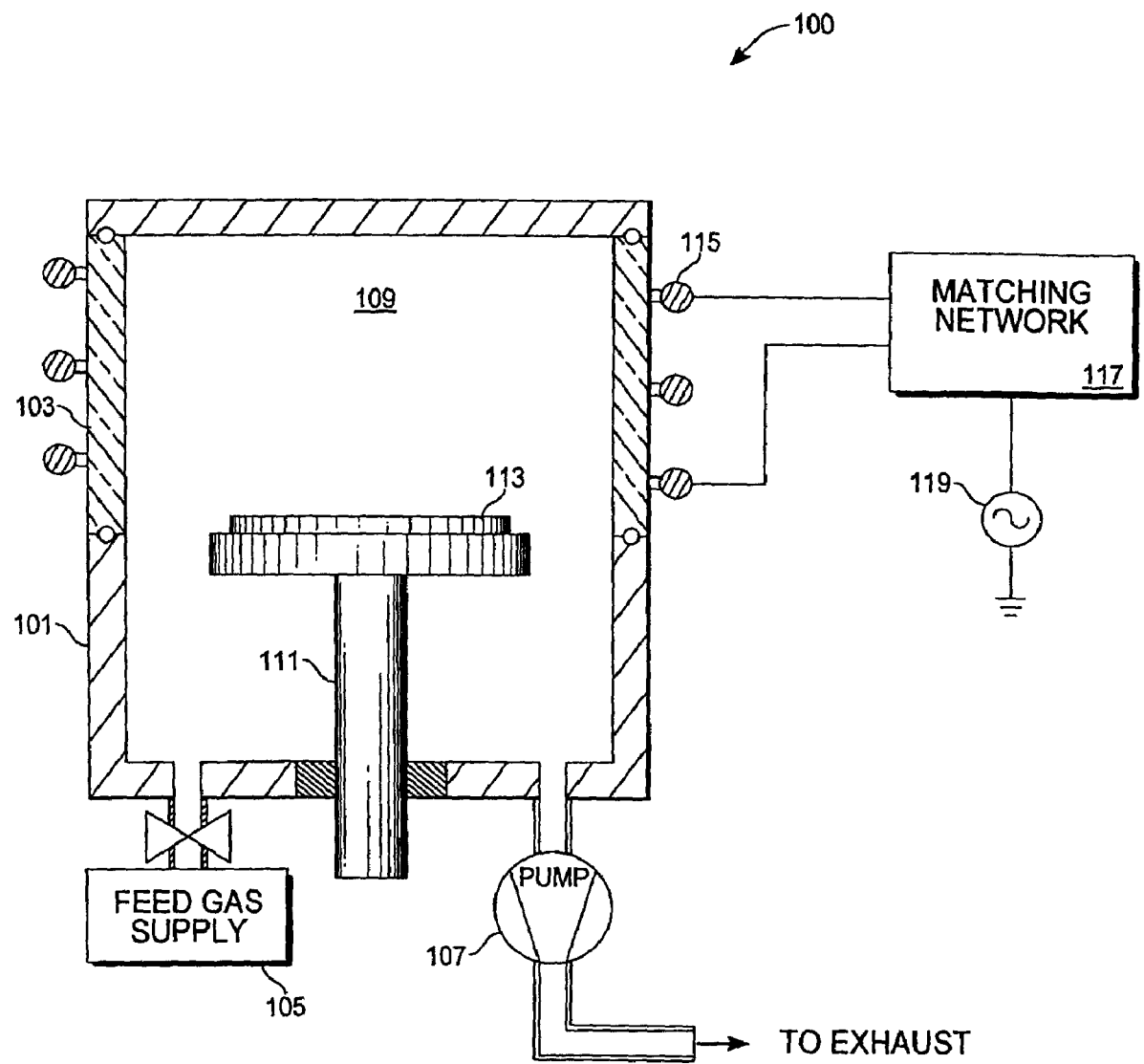
FIG. 1 is simplified a cross-sectional view of a portion of a prior art plasma-based process chamber with associated support equipment.
Figure 2:
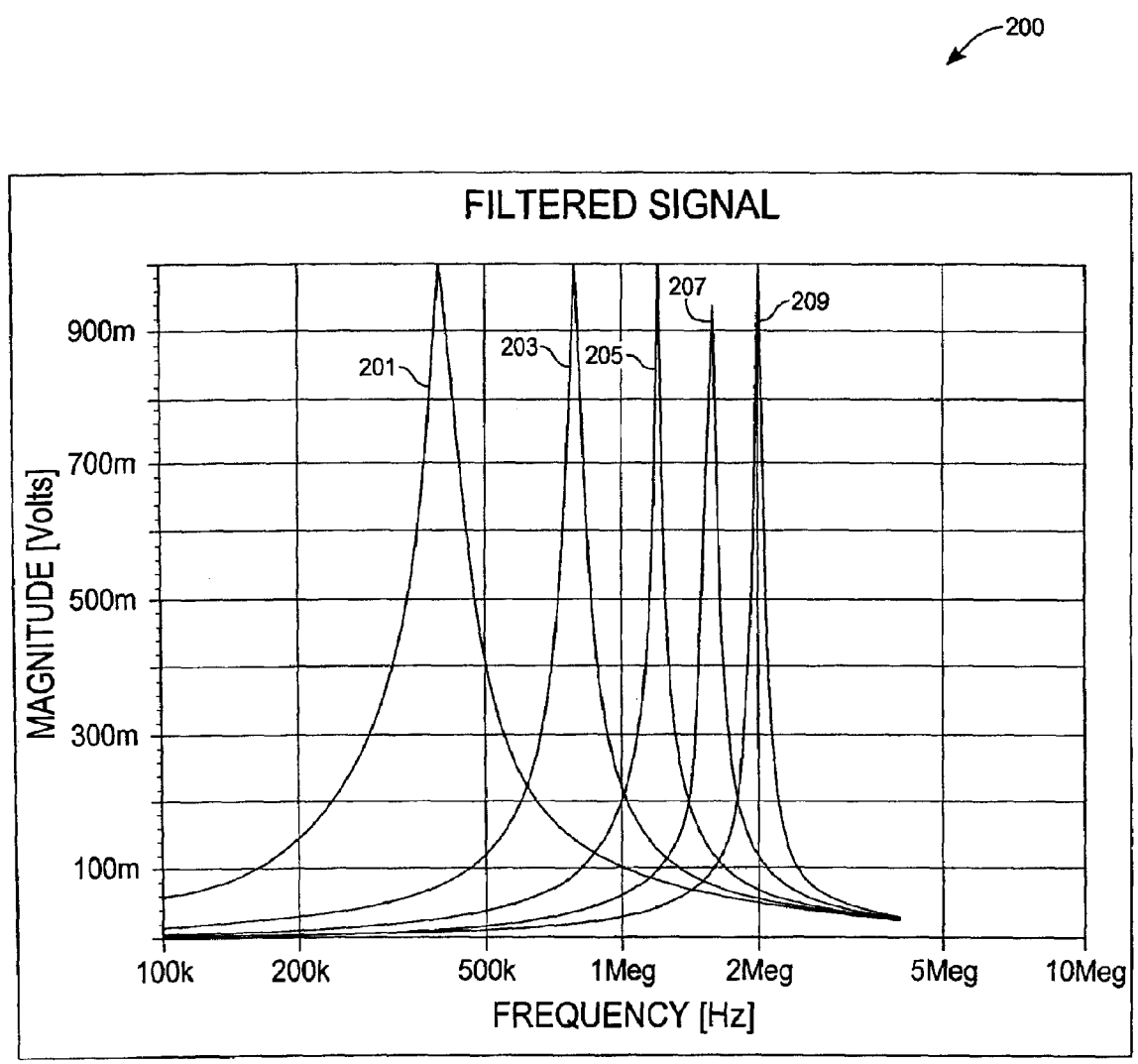
FIG. 2 is a spectral frequency domain graph showing relative magnitudes of a fundamental frequency and four harmonic frequencies.

With reference to FIG. 2, an exemplary spectral frequency domain graph 200 indicates a fundamental frequency 201 (i.e., first harmonic) of a generated RF bias supply signal at 400 kHz. A 400 kHz fundamental frequency ($f_0$) sine wave is a common RF input signal used in plasma generation systems of the prior art. However, the input complex waveform (not shown) in the exemplary spectral frequency domain graph 200 also produces a second ($f_1$) 203, third ($f_2$) 205, fourth ($f_3$) 207, and fifth ($f_4$) 209 harmonic frequency of roughly equal voltage magnitude levels. A skilled artisan will recognize that voltage magnitude levels may also be varied as needed for a particular process. An exemplary physical implementation of the importance of the spectral frequency domain graph 200 is described with reference to FIG. 3, immediately below.

Figure 3:
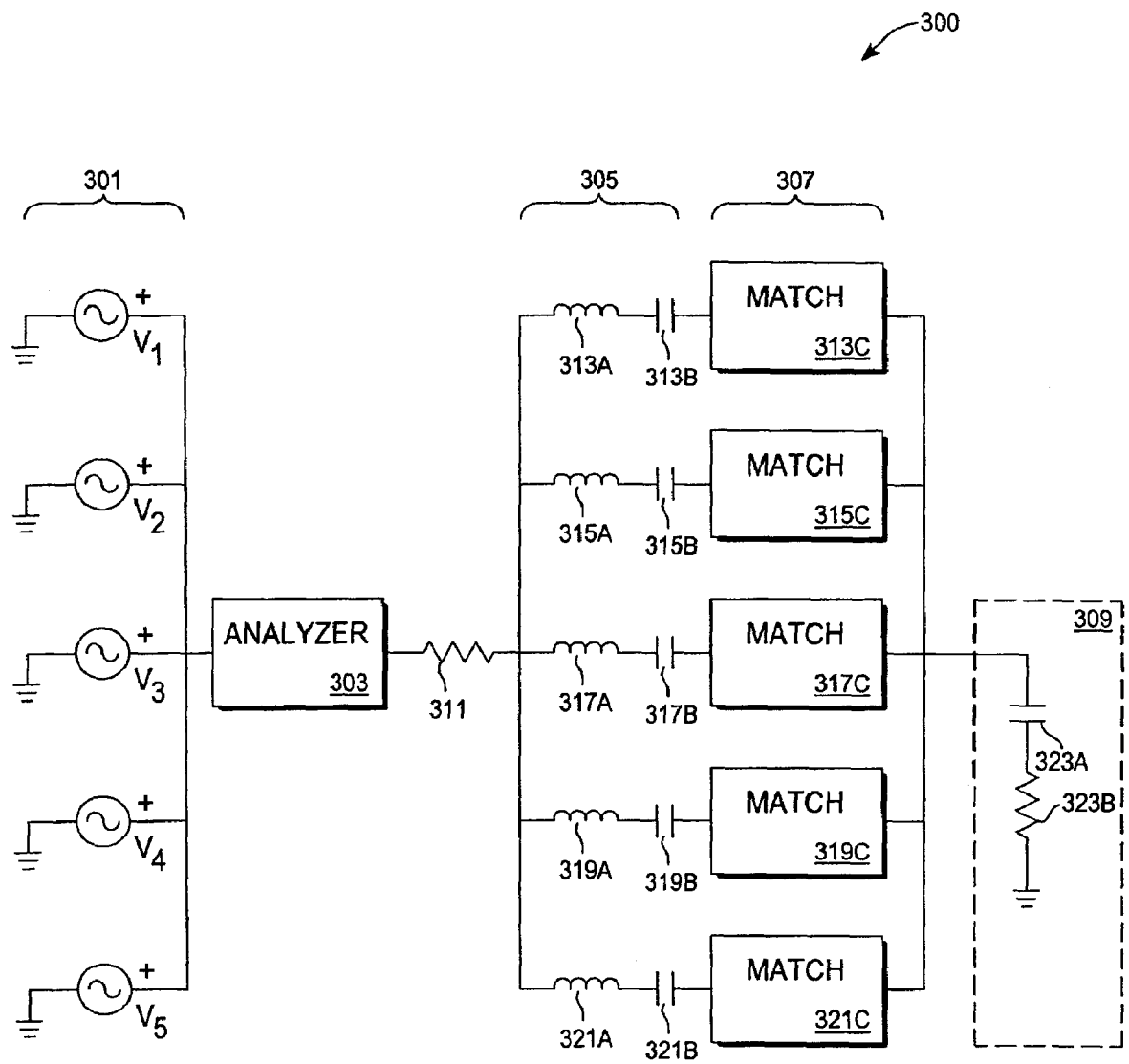
FIG. 3 is an exemplary schematic of a circuit including bandpass filters and associated matching networks for a complex bias-voltage waveform.

Referring now to FIG. 3, an exemplary filter circuit 300 utilizes a series of filters to split the incoming complex waveform into constituent harmonic frequencies. Each of the constituent harmonic frequencies can then be individually matched to the plasma load. Although the exemplary filter circuit 300 indicates a series of bandpass filters, a skilled artisan will recognize that a circuit having similar filtering abilities may be formed from a variety of filter types known in the art including, for example, low pass, high pass, or notch filters which may be formed from various filter sections known in the art (e.g., "T" sections, "π" sections, and others).

The exemplary filter circuit 300 includes a plurality of RF generators 301, an optional frequency analyzer 303, a plurality of frequency splitter circuits 305, a plurality of matching networks 307, and a schematic representation of a plasma chamber 309 with an associated reactive load consisting of, generally, a capacitive component 323A and a resistive component 323B.

In a specific exemplary embodiment, a value of the capacitive component 323A of the plasma chamber 309 is 100 picofarads (pF) and a value of the resistive component 323B is 50 ohms. The impedance of a capacitive component, $Z_c$, is inversely related to the value of capacitance, C, by $$Z_c = \frac{1}{j\omega_0 C}$$

where $\omega_0$ is a value of angular frequency of the incoming harmonic signal. Since the value of the capacitive component 323A is quite small, the impedance is strongly dependent upon both the value of the capacitive component 323A and the angular frequency. Thus, the overall impedance of the plasma chamber 309 is dependent on the driving frequencies. As a result of the broad range of frequencies employed, each of the plurality of matching networks 307 must adjust for significantly differing impedance levels on both the input and output side as described below.

The plurality of RF generators 301 may be comprised of any number of individual generators (although only five are shown in this exemplary embodiment), each producing a single RF bias voltage. Outputs of the plurality of RF generators 301 may be combined by a summing device (not shown but known in the art). Alternatively, the plurality of RF generators 301 may be replaced by a single digital signal generator (not shown) such as, for example, a high-powered Fourier signal generator known in the art.

In a specific exemplary embodiment, the plurality of RF generators 301 is capable of producing the exemplary spectral frequency domain graph 200 of FIG. 2 having the frequencies indicated in Table I, below.

TABLE I

| fundamental frequency $f_0$ | second harmonic frequency $f_1$ | third harmonic frequency $f_2$ | fourth harmonic frequency $f_3$ | fifth harmonic frequency $f_4$ |
|---|---|---|---|---|
| 400 kHz | 800 kHz | 1.2 MHz | 1.6 MHz | 2.0 MHz |

The optional frequency analyzer 303 analyzes the complex input waveform and produces a frequency domain representation of the original input waveform. The optional frequency analyzer 303 therefore breaks the input waveform down into individual frequency representations or components of the complex waveform.

For example, a square wave is a common non-sinusoidal waveform used in various types of electronic circuits including digital signal processing applications. Although the square wave itself is non-sinusoidal in nature, it is actually comprised of an infinite series of odd-order integral harmonics of sinusoidal waves. Similarly, a sawtooth waveform is comprised of an infinite series of both odd-order and even-order integral harmonics of sinusoidal waves.

Regardless of the input waveform, the optional frequency analyzer 303 is capable of discerning the individual frequency components that produce the complex input waveform along with respective magnitudes of each of the harmonic frequencies. In a specific exemplary embodiment, the optional frequency analyzer 303 is produced based upon a fast Fourier transform (FFT) algorithm, known independently in the art.

The optional frequency analyzer 303 may be configured to provide a feed-forward loop (not shown) to each of the plurality of matching networks 307, described below. Further, the optional frequency analyzer 303 may be configured to provide a feed-forward loop (not shown) to each of the plurality of frequency splitter circuits 305 as well thereby providing both circuit types with the actual constituent frequency of each portion of the complex waveform thus providing a fully tuned circuit. The feed-forward loop would utilize active filters and/or variable inductive and capacitive elements to provide tuning for each circuit type. Such active filters and variable discrete components are known independently in the art.

In a specific exemplary embodiment where each of the constituent frequencies is known and fixed, the optional frequency analyzer 303 may not be necessary.

A resistor 311 is placed in series with a plurality of inductors (313A, 315A, . . . , 321A) and capacitors (313B, 315B, . . . , 321B). Each pairing of the plurality of inductors (313A, 315A, . . . , 321A) and capacitors (313B, 315B, . . . , 321B) provides one of the filters in the plurality of frequency splitter circuits 305 for input to the plurality of matching networks 307. As will be recognized by a skilled artisan, any number of resistors, capacitors, and inductors may be used in various configurations to produce filter splitter circuits having similar functions. Additionally, various types of transmission lines or active filters (e.g., power-driven capacitors and similar components known independently in the art) may also be used in particular filter arrangements.

Generally a high quality, or high-Q, matching network is utilized in order to maximize power transfer and minimize reflections from the plurality of RF generators 301 to the representation of the plasma chamber 309. A Q-rating of a filter is based upon an ability of the filter to select or reject a range of frequencies that is narrow in comparison to a center frequency. Thus, the Q-rating of a filter is defined as the ratio of the center frequency to the frequency bandwidth at −3 dB. Thus, the Q-rating of a series-connected RLC circuit is determined by $$Q = \frac{1}{R}\sqrt{\frac{L}{C}}$$

where R is a value of the serial resistance and L is a value of the serial inductance. As noted from the governing equation, a high-Q value is partially ensured based upon selecting a small value of serial resistance. In a specific embodiment of the exemplary filter circuit 300, the resistor 311 is selected to be 0.001 ohms, thus ensuring a high-Q value of the matching network. Table II, below, indicates values of inductance and capacitance selected for resonance with a given harmonic frequency along with Q-rating values and bandwidth for a 0.001 ohm serial resistor.

TABLE II

| Resonant Frequency [kHz] | Resonant Angular Frequency [rad/sec] | Inductance [µH] | Capacitance [pF] | Q | Δf [Hz] |
|---|---|---|---|---|---|
| 400 | 6.29E+05 | 313A: 100 | 313B: 1580 | 2.52E+05 | 1.59 |
| 800 | 1.26E+06 | 315A: 100 | 315B: 396 | 5.03E+05 | 1.59 |
| 1200 | 1.88E+06 | 317A: 100 | 317B: 176 | 7.54E+05 | 1.59 |
| 1600 | 2.51E+06 | 319A: 100 | 319B: 98.8 | 1.01E+06 | 1.59 |
| 2000 | 3.14E+06 | 321A: 100 | 321B: 63.3 | 1.26E+06 | 1.59 |

With continued reference to FIG. 3, the plurality of matching networks 307 may include various filter elements listed herein and may also include various types of active matching filters. The plurality of matching networks 307 may include various passive filter types include "L" sections, "T" sections, "π" sections, or any combination of these sections in either a direct or cascaded arrangement. Each of the section types is known independently in the art. Also, both active filters and amplifiers (e.g., such as tunable narrowband amplifiers) may be used independently or in various combinations with discrete components.

The present invention is described above with reference to specific embodiments thereof. It will, however, be evident to a skilled artisan that various modifications and changes can be made thereto without departing from the broader spirit and scope of the present invention as set forth in the appended claims.

For instance, particular embodiments describe a number of circuit types in particular arrangements. A skilled artisan will recognize that these circuit types and arrangements may be varied and those shown herein are for exemplary purposes only in order to illustrate the novel nature of the RF bias voltage matching concepts. For example, a skilled artisan will recognize that each of the frequency splitter circuits may be combined with the associated circuit of the matching network for each of the frequencies. Additionally, a skilled artisan will further recognize that the techniques and circuits described herein may be applied to any system where a matching network with a complex driving waveform is required. The application to a plasma chamber in the semiconductor industry is purely used as an exemplar to aid one of skill in the art in describing various embodiments of the present invention.

Moreover, the term semiconductor should be construed throughout the description to include data storage, flat panel display, as well as allied or other industries. These and various other embodiments are all within a scope of the present invention. The specification and drawings are, accordingly, to be regarded in an illustrative rather than a restrictive sense.

What is claimed is:

1. A complex waveform frequency matching device comprising:
    a plurality of radio frequency generators coupled in parallel with one another, each subsequent one of the plurality of radio frequency generators configured to produce a harmonic frequency related by an integral multiple to a frequency produced by any lower-frequency producing radio frequency generator, thereby generating a complex waveform;
    a plurality of frequency splitter circuits coupled to an output of the plurality of radio frequency generators; and
    a plurality of matching networks, each of the plurality of matching networks having an input coupled to an output of one of the plurality of frequency splitter circuits and an output configured to be coupled to a plasma chamber, the plurality of matching networks being configured to provide multiple frequencies of the complex waveform to the plasma chamber concurrently.

2. The complex waveform frequency matching device of claim 1 wherein each of the plurality of matching networks is configured to match an impedance of a center frequency received from one of the plurality of frequency splitter circuits to an input impedance of the plasma chamber.

3. The complex waveform frequency matching device of claim 1 further comprising a resistive element coupled between the output of the plurality of radio frequency generators and the input of the plurality of frequency splitter circuits, the resistive element being selected to allow a high quality value to be achieved by each of the plurality of frequency splitter circuits.

4. The complex waveform frequency matching device of claim 1 wherein the plurality of matching networks is comprised of a plurality of narrowband amplifiers.

5. The complex waveform frequency matching device of claim 1 further comprising a frequency analyzer coupled between the output of the plurality of radio frequency generators and the input of the plurality of frequency splitter circuits.

6. The complex waveform frequency matching device of claim 5 further comprising a feed-forward loop coupled to the plurality of frequency splitter circuits and configured to adjust a resonant frequency of each of the plurality of frequency splitter circuits based upon a determination of constituent frequencies of the complex waveform.

7. The complex waveform frequency matching device of claim 5 further comprising a feed-forward loop coupled to the plurality of matching networks and configured to adjust a resonant frequency of each of the plurality of matching networks based upon a determination of constituent frequencies of the complex waveform.

8. The complex waveform frequency matching device of claim 5 wherein the frequency analyzer is configured to perform a fast Fourier transform and determine constituent frequencies of the complex waveform.

9. A complex waveform frequency matching device comprising:
    a plurality of radio frequency generators coupled in parallel with one another, each subsequent one of the plurality of radio frequency generators configured to produce a harmonic frequency related by an integral multiple to a frequency produced by any lower-frequency producing radio frequency generator, thereby generating a complex waveform;

a frequency analyzer coupled to an output of the plurality of radio frequency generators;

a plurality of frequency splitter circuits coupled to an output of the frequency analyzer; and a plurality of matching networks, each of the plurality of matching networks having an input coupled to an output of one of the plurality of frequency splitter circuits and an output configured to be coupled to a plasma chamber, the plurality of matching networks being configured to provide multiple frequencies of the complex waveform to the plasma chamber concurrently.

10. The complex waveform frequency matching device of claim 9 further comprising a feed-forward loop coupled to the plurality of frequency splitter circuits and configured to adjust a resonant frequency of each of the plurality of frequency splitter circuits based upon a determination of constituent frequencies of the complex waveform.

11. The complex waveform frequency matching device of claim 9 further comprising a feed-forward loop coupled to the plurality of matching networks and configured to adjust a resonant frequency of each of the plurality of matching networks based upon a determination of constituent frequencies of the complex waveform.

12. The complex waveform frequency matching device of claim 9 wherein each of the plurality of matching networks is configured to match an impedance of a center frequency received from one of the plurality of frequency splitter circuits to an input impedance of the plasma chamber.

13. The complex waveform frequency matching device of claim 9 further comprising a resistive element coupled between the output of the plurality of radio frequency generators and the input of the plurality of frequency splitter circuits, the resistive element being selected to allow a high quality value to be achieved by each of the plurality of frequency splitter circuits.

14. The complex waveform frequency matching device of claim 9 wherein the plurality of matching networks is comprised of a plurality of narrowband amplifiers.

15. The complex waveform frequency matching device of claim 9 wherein the frequency analyzer is configured to perform a fast Fourier transform and determine constituent frequencies of the complex waveform.

16. A complex waveform frequency matching device comprising:

a radio frequency generator configured to generate a complex waveform, the complex waveform being comprised of a plurality of frequencies;

a plurality of frequency splitter circuits coupled to an output of the radio frequency generator; and a plurality of matching networks, each of the plurality of matching networks having an input coupled to an output of one of the plurality of frequency splitter circuits and an output configured to be coupled to a plasma chamber, the plurality of matching networks being configured to provide the plurality of frequencies of the complex waveform to the plasma chamber concurrently.

17. The complex waveform frequency matching device of claim 16 wherein each of the plurality of matching networks is configured to match an impedance of a center frequency received from one of the plurality of frequency splitter circuits to an input impedance of the plasma chamber.

18. The complex waveform frequency matching device of claim 16 further comprising a resistive element coupled between the output of the radio frequency generator and the input of the plurality of frequency splitter circuits, the resistive element being selected to allow a high quality value to be achieved by each of the plurality of frequency splitter circuits.

19. The complex waveform frequency matching device of claim 16 wherein the radio frequency generator is a digital signal generator.

20. The complex waveform frequency matching device of claim 16 wherein the plurality of matching networks is comprised of a plurality of narrowband amplifiers.

21. The complex waveform frequency matching device of claim 16 further comprising a frequency analyzer coupled between the output of the radio frequency generator and the input of the plurality of frequency splitter circuits.

22. The complex waveform frequency matching device of claim 21 further comprising a feed-forward loop coupled to the plurality of frequency splitter circuits and configured to adjust a resonant frequency of each of the plurality of frequency splitter circuits based upon a determination of constituent frequencies of the complex waveform.

23. The complex waveform frequency matching device of claim 21 further comprising a feed-forward loop coupled to the plurality of matching networks and configured to adjust a resonant frequency of each of the plurality of matching networks based upon a determination of constituent frequencies of the complex waveform.

24. The complex waveform frequency matching device of claim 21 wherein the frequency analyzer is configured to perform a fast Fourier transform and determine constituent frequencies of the complex waveform.

25. A complex waveform frequency matching device, the device comprising:

a radio frequency generator configured to generate a complex waveform;

a plurality of frequency splitter circuits coupled to an output of the radio frequency generator;

a frequency analyzer coupled between the radio frequency generator and the plurality of frequency splitter circuits, the frequency analyzer being configured to perform a fast Fourier transform and determine constituent frequencies of the complex waveform; and a plurality of matching networks, each of the plurality of matching networks having an input coupled to an output of one of the plurality of frequency splitter circuits and an output configured to be coupled to a plasma chamber.

26. The complex waveform frequency matching device of claim 25 further comprising a resistive element coupled between the radio frequency generator and the plurality of frequency splitter circuits, the resistive element being selected to allow a high quality value to be achieved by each of the plurality of frequency splitter circuits.

27. A complex waveform frequency matching device, the device comprising:

a radio frequency generator configured to generate a complex waveform;

a plurality of frequency splitter circuits coupled to an output of the radio frequency generator;
a resistive element coupled between the radio frequency generator and the plurality of frequency splitter circuits, the resistive element being selected to allow a high quality value to be achieved by each of the plurality of frequency splitter circuits; and
a plurality of matching networks, each of the plurality of matching networks having an input coupled to an output of one of the plurality of frequency splitter circuits and an output configured to be coupled to a plasma chamber.

28. The complex waveform frequency matching device of claim 27 further comprising a frequency analyzer coupled between the radio frequency generator and the plurality of frequency splitter circuits.

29. The complex waveform frequency matching device of claim 28 wherein the frequency analyzer is configured to perform a fast Fourier transform and determine constituent frequencies of the complex waveform.

* * * * *